(12) United States Patent
Blakely

(10) Patent No.: US 6,184,673 B1
(45) Date of Patent: Feb. 6, 2001

(54) ACTIVE RESET CURRENT SENSOR WITH MEASUREMENT FEEDBACK

(75) Inventor: John H. Blakely, Weaverville, NC (US)

(73) Assignee: Rockwell Technologies, LLC, Thousands Oaks, CA (US)

( * ) Notice: Under 35 U.S.C. 154(b), the term of this patent shall be extended for 0 days.

(21) Appl. No.: 09/160,476

(22) Filed: Sep. 24, 1998

(51) Int. Cl.[7] .......................... G01R 19/00; G01R 19/08; G01R 33/00
(52) U.S. Cl. ...................................... 324/117 R; 324/127
(58) Field of Search .......................... 324/117 R, 117 H, 324/127, 129; 323/249, 302, 310, 329

(56) References Cited

U.S. PATENT DOCUMENTS

| | | | |
|---|---|---|---|
| 4,276,510 | * 6/1981 | Tomkins et al. | 324/117 R X |
| 4,454,553 | * 6/1984 | Iwasaki | 324/117 R X |
| 4,682,100 | * 7/1987 | Hagelin | 324/117 R |
| 4,899,103 | * 2/1990 | Katzenstein | 324/117 R X |
| 4,914,383 | * 4/1990 | Wilkerson | 324/127 |
| 5,053,695 | * 10/1991 | Canter | 324/117 R |

OTHER PUBLICATIONS

*Measurement Products Catalog,* Tektronix, Inc., 1997/1998, pp. 1–2 and 506.

* cited by examiner

Primary Examiner—Gerard Strecker
(74) *Attorney, Agent, or Firm*—David G. Luettgen; John J. Horn; William R. Walbrun

(57) ABSTRACT

In a method of measuring a current, the current is received at a winding and permitted to flow through the winding, which is wound about a core. The flow of the current through the winding induces a first magnetic flux that flows through the core and that tends to drive the core into saturation. The core is actively reset to prevent the core from being saturated at least during selected time intervals. The current is then measured during at least a plurality of the selected time intervals. In a particularly preferred embodiment, the winding is a primary winding and the resetting step includes applying a reset voltage to a secondary winding using a source that is coupled to the secondary winding. The reset voltage determines a rate at which a net magnetic flux that flows in the core changes in a direction away from saturation. Advantageously, the current sensing method has a tremendous dynamic range. The current sensing method is especially well suited to measuring currents that are of a low frequency and/or a high magnitude, including DC currents.

23 Claims, 4 Drawing Sheets

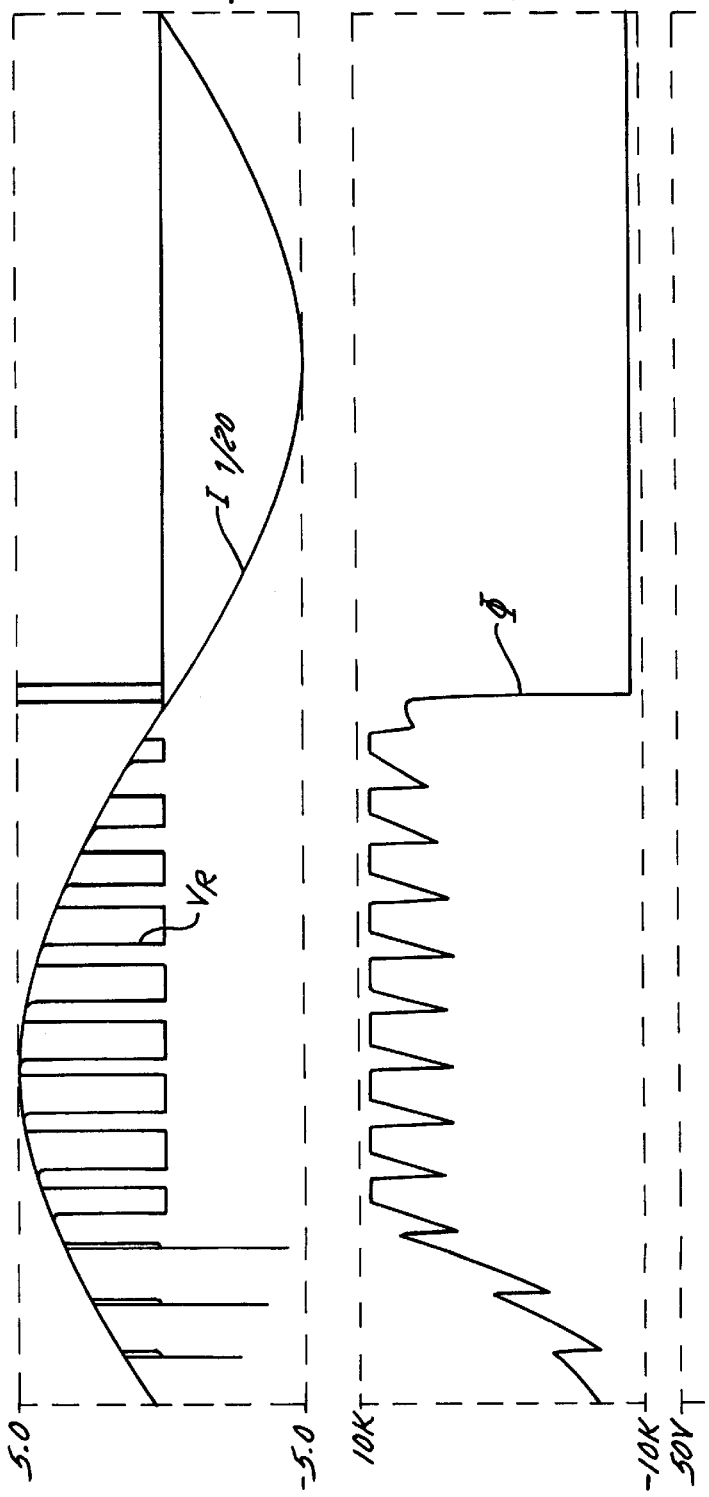

ACTIVE RESET CURRENT SENSOR WITH MEASUREMENT FEEDBACK

BACKGROUND OF THE INVENTION

1. Field of the Invention

The present invention relates to current sensors. In a particularly preferred embodiment, the present invention relates to a current transformer with a core that is actively reset to prevent continuous saturation. The present invention also relates to methods of sensing current.

2. Description of Related Art

Current transformers are widely used for measuring current. A current transformer comprises primary and secondary windings that are wound about a transformer core. A primary current $I_1$, which is the current that the current transformer is used to measure, flows through the primary winding. The primary current $I_1$ induces a magnetic flux which flows through the transformer core and which induces a secondary current $I_2$ in the secondary winding. For a linear (unsaturated) current transformer, the primary current $I_1$ multiplied by the number of turns $N_1$ on the primary winding is equal to the secondary current $I_2$ multiplied by the number of turns $N_2$ on the secondary winding:

$$I_1 N_1 = I_2 N_2 \quad (1)$$

Therefore, since the parameters $N_1$ and $N_2$ are known, the primary current $I_1$ may be measured indirectly by measuring the secondary current $I_2$. The secondary current $I_2$ may be measured using a burden resistor that is placed across the secondary winding. In particular, the flow of the secondary current $I_2$ through the burden resistor creates a voltage $V_2$ across the burden resistor which can be used to determine the current $I_1$ using the following relationship:

$$I_1 = \frac{V_2}{R_b}\left(\frac{N_2}{N_1}\right) \quad (2)$$

where $R_b$ is the resistance of the burden resistor. As a result, the primary current $I_1$ may be determined by measuring the voltage $V_2$.

This arrangement is only usable, however, when the current transformer is not saturated, that is, when the amount of magnetic flux flowing the transformer core has not reached a maximum level. When the current transformer saturates, Eqs. (1) and (2) no longer apply.

The conventional solution to this problem is to use a current transformer with a higher volt-second rating. The volt-second rating is a measure of the amount of magnetic flux that can flow through the transformer core without the transformer core saturating. (Conventionally, the unit of magnetic flux is the Weber. However, for time-varying magnetic fields, the Weber is equivalent to the product of volts and seconds.) In practice, the volt-second rating is the main parameter which limits the dynamic range of a current transformer in terms of the magnitude and frequency of currents that may be measured. In general, the lower the frequency of the primary current, and/or the higher the magnitude of the primary current, the more likely the current transformer is to saturate.

Current transformers may be constructed so as to have a higher volt-second rating by increasing the cross sectional area of the transformer core. However, increasing the cross sectional area of the transformer core increases the size and cost of the current transformer. Moreover, as the frequency of the current which must be measured decreases and as the magnitude of the current which must be measured increases, a point is always reached at which it becomes impractical to construct the required current transformer. For example, to measure a DC current in steady state according to conventional approaches, a current transformer having a core with an infinite cross section would be needed. Of course, no such current transformer exists.

In general, most circuit designers use current transformers with the knowledge that Eqs. (1) and (2) apply so long as saturation is avoided. If saturation is a concern, then a current transformer with a larger core is utilized. However, little if any thought is ever given by most circuit designers to the fundamental problem of saturation.

In order to fully understand the problem of saturation, it is helpful to undertake a more detailed consideration of the operation of any current transformer. When the primary current $I_1$ flows through the primary winding, the primary current $I_1$ induces a magnetic flux $\Phi_1$ that flows through the transformer core and that magnetically couples the primary winding and the secondary winding. The magnetic flux $\Phi_1$ induces the secondary current $I_2$ in the secondary winding, and the secondary current $I_2$ itself also induces a magnetic flux $\Phi_2$. Like the magnetic flux $\Phi_1$, the magnetic flux $\Phi_2$ flows through the transformer core and magnetically couples the primary winding and the secondary winding. If Eq. (1) was exactly true, the magnetic flux $\Phi_1$ and the magnetic flux $\Phi_2$ would cancel and no net magnetic flux would flow through the transformer core. In practice, however, slightly less current flows in the secondary winding than the amount predicted by Eq. (1). This difference is attributable, in general, to the fact that a non-zero voltage is developed across the secondary winding (due to the internal resistance of the secondary winding and the resistance of the burden resistor). As a result of the slight difference, there is a net magnetic flux $\Phi$ which flows through the transformer core. When the primary current $I_1$ is a low frequency and/or high magnitude current, the magnetic flux $\Phi_1$, and in particular the net magnetic flux $\Phi$, tends to drive the transformer core into saturation.

In some respects, the non-zero voltage that is developed across the secondary winding is a nuisance which causes measurement inaccuracies and which should be minimized to the extent possible. Perhaps ironically, however, it would be undesirable to eliminate the non-zero voltage altogether because the non-zero voltage is what permits the primary current $I_1$ to be measured. Without any voltage developed across the secondary winding, no current would flow through the secondary winding and no voltage would be developed across the burden resistor. Consequently, it would not be possible to measure the primary current $I_1$.

The voltage $V_2$ that is developed across the secondary winding is related to the net magnetic flux $\Phi$ in the following manner:

$$V_2 = N\frac{d\Phi}{dt} \quad (3)$$

where $N$ is the turns ratio ($N_1/N_2$). (Although Eq. (3) is sometimes written with a minus sign before the right-hand term, a minus sign is not used herein.)

From Eq. (3), it is seen that the voltage $V_2$ that is developed across the secondary winding is proportionally related to the change in the net magnetic flux $\Phi$ with respect to time. In saturation, since the net magnetic flux $\Phi$ stays at a constant saturated level, there are no time varying changes in the net magnetic flux $\Phi$. As a result, there is no voltage developed across the secondary winding ($V_2 = 0$) and there is no secondary current that flows through the secondary winding ($I_2=0$). This is true even though current continues to flow in the primary winding ($I_1 \neq 0$). It is therefore apparent that, in saturation, Eqs. (1) and (2) do not apply and the primary current $I_1$ cannot be measured.

Other approaches do exist for measuring current. For example, another device which has been used to measure current is the Hall-effect sensor. In a Hall-type current sensing arrangement, the measured current induces a magnetic flux in a core in a manner similar to a current transformer. However, rather than using a secondary winding to sense the measured current, a Hall-effect sensor is placed in the path of the magnetic flux. The measured current is then measured by using the Hall-effect sensor to measure the magnetic flux in the core. However, since this arrangement also uses a core, it too is subject to the above-mentioned saturation problems.

BRIEF SUMMARY OF THE INVENTION

The present invention overcomes the above-mentioned problems. In particular, according to one aspect of the invention, the invention provides a method of measuring a current in which the current is received at a winding and permitted to flow through the winding. The winding is wound around a core, and the flow of the current through the winding induces a first magnetic flux that flows through the core and that tends to drive the core into saturation. The core is actively reset to prevent the core from being saturated at least during selected time intervals. The current is then measured during at least a plurality of the selected time intervals.

In a particularly preferred embodiment, the winding is a primary winding and the resetting step includes applying a reset voltage to a secondary winding using a source that is coupled to the secondary winding. Like the primary winding, the secondary winding is wound around the core. The secondary winding is magnetically coupled to the primary winding by the first magnetic flux. The reset voltage determines a rate at which a net magnetic flux that flows in the core changes in a direction away from saturation. The net magnetic flux is the sum of all magnetic fluxes that magnetically couple the primary and the secondary windings. In an especially preferred embodiment, the magnitude of the rate at which the net magnetic flux changes in the direction away from saturation is approximately proportional to the magnitude of the reset voltage that is applied to the secondary winding.

According to another aspect of the invention, the present invention provides a circuit for measuring a first current comprising a core, a first winding, a second winding, a switch, a source and a controller. The first winding is wound around the core and has the first current flowing therethrough. The flow of the first current induces a first magnetic flux that flows through the core and that tends to drive the core into saturation. The second winding, which is also wound around the core, is magnetically coupled to the first winding by the first magnetic flux.

The controller is electrically coupled to the switch, and provides a control signal to the switch that causes the switch to selectively couple the source to the second winding. When the source is coupled to the second winding, the source causes a reset magnetic flux to flow through the core. The reset magnetic flux opposes the first magnetic flux and at least temporarily prevents the core from being saturated. In an especially preferred embodiment, for at least a part of the time that the source is not coupled to the second winding, the first magnetic flux induces a second current to flow in the second winding. The controller then causes the second current to be measured to obtain a measurement of the first current.

Advantageously, the present invention provides a current sensing system with a tremendous dynamic range. The current sensing system is able to measure currents that are both of a low frequency and a high magnitude. For example, the current sensing system can even measure DC currents which in steady state would otherwise require a transformer core with an infinite cross section. However, the current sensing system can be used throughout a wide range of frequencies with beneficial effects. To measure a current of a given frequency, for example, the current sensing system is able to utilize a current transformer that has a core with a reduced cross section as compared to that which would be needed by conventional current measuring systems. Moreover, as the magnitude of the measured current increases, the increased magnitude may be addressed by supplying more current when the transformer core is actively reset. Thus, it is not necessary to increase the size of the cross section of the transformer core to handle larger magnitude currents. Finally, these advantages can be achieved by way of a circuit that is simple and that is possible to implement with a minimum number of additional parts. Therefore, the foregoing benefits may be achieved with minimal additional size, cost and complexity.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which:

FIGS. 5A–5C are graphs that show the operation of the system of FIG. 1 in conjunction with a sinusoidal primary current.

DETAILED DESCRIPTION OF THE PREFERRED EMBODIMENTS

Figure 1:
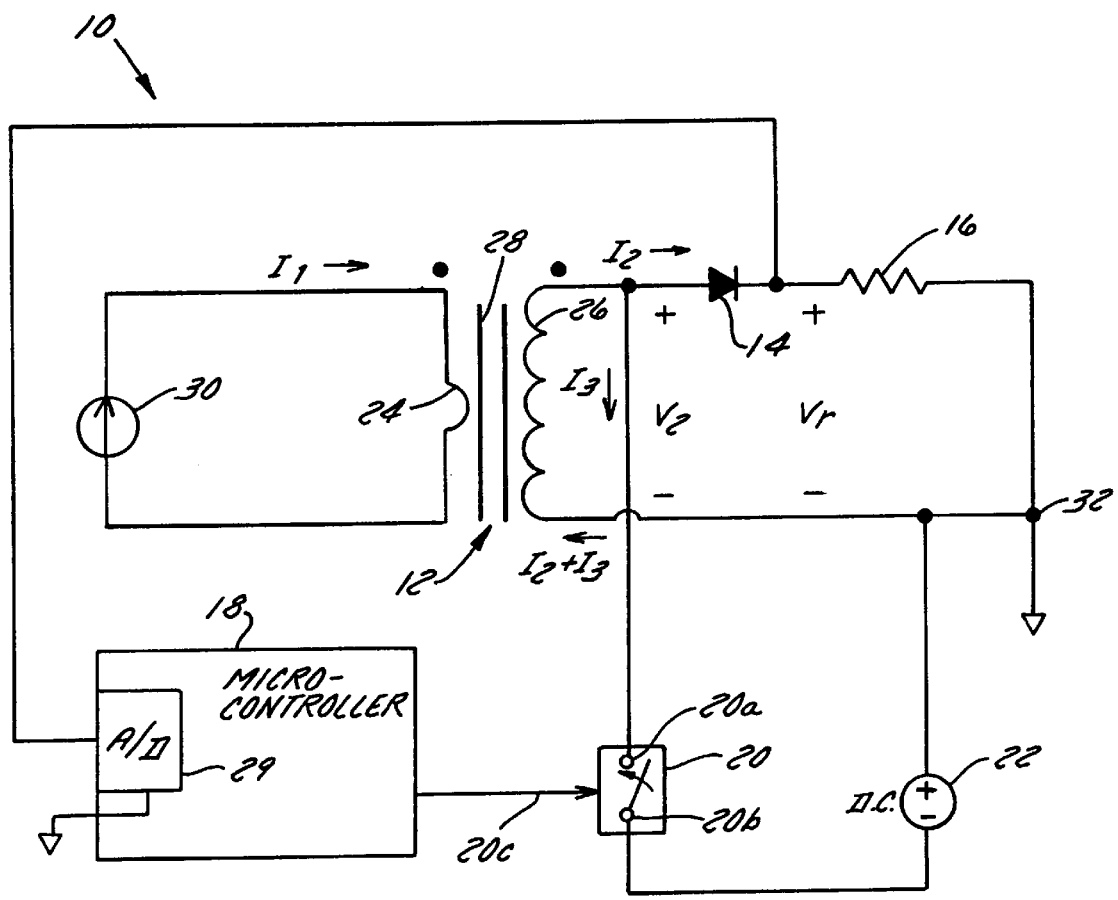
FIG. 1 is a schematic diagram of a current sensing system that utilizes a current transformer, in accordance with one embodiment of the present invention.

Referring now to FIG. 1, a first embodiment of a current sensing system 10 in accordance with one embodiment of the present invention is illustrated. The current sensing system 10 comprises a current transformer 12, a diode 14, a burden resistor 16, a controller 18, a switch 20 and a source 22. The current transformer 12 further includes a primary winding 24 and a secondary winding 26 both of which are wound around a transformer core 28. The controller 18 preferably is implemented using a microprocessor (not illustrated) and preferably includes an analog-to-digital (A/D) converter 29. The controller 18 controls the switch 20, which for simplicity is shown only functionally in FIG. 1.

The primary winding 24 of the current transformer 12 receives a primary current $I_1$ produced by an energy source 30. The primary current $I_1$ is the current that the system 10 is used to measure. In the illustrated embodiment, the system 10 is used to measure the magnitude of the primary current $I_1$. Of course, the system 10 could also be used to measure the frequency of the current $I_1$ or to measure some other parameter. Although the source 30 is shown in FIG. 1 using the typical symbol for a simple current source, it should be understood that the source 30 could be any device that is capable of producing a current or voltage, and could be coupled to the primary winding 24 either directly or by way of additional circuit elements. Likewise, although the source 22 is shown in FIG. 1 using the typical symbol for a simple voltage source, it should be understood that the source 22 could be any device that is capable of producing a current or voltage, and could be coupled to the secondary winding 26 by the switch 20 either directly or by way of additional circuit elements.

The secondary winding 26 of the current transformer 12 carries a current $I_2+I_3$ which is the sum of a current $I_2$ and a current $I_3$. The current $I_2$ is the secondary current and is induced by the flow of the primary current $I_1$ when the current transformer 12 is in a linear operating region. The current $I_3$ is produced by the voltage source 22. Although the current $I_3$ flows through the secondary winding, it is not referred to as a secondary current for sake of avoiding confusion with the current $I_2$. Instead, the current $I_3$ will be referred to as the reset current.

Generally, either the secondary current $I_2$ will be equal to zero (i.e., when the switch 20 is closed) or the reset current $I_3$ will be equal to zero (i.e., when the switch 20 is open). Therefore, the current $I_2+I_3$ through the secondary winding 26 will be equal to either the current $I_2$ or to the current $I_3$, depending on whether the switch 20 is opened or closed.

Referring now to FIGS. 2A–2C, the operation of the system 10 illustrated in FIG. 1 will now be described in greater detail. By way of overview, the transformer core 28 is actively reset to prevent the transformer core from being saturated at least during selected time intervals. To this end, the voltage source 22 is selectively coupled to the secondary winding 26 using the switch 20. When the voltage source 22 is coupled to the secondary winding, a negative voltage $V_2$ is applied to the secondary winding 26. Since the voltage $V_2$ is negative, the net magnetic flux Φ in the transformer core 28 decreases in accordance with Eq. (3). This creates time intervals during which the transformer core is not saturated. The primary current $I_1$ may then be measured during a latter portion of these time intervals.

First, each of FIGS. 2A–2C is discussed individually. Thereafter, FIGS. 2A–2C are discussed in combination with respect to a chronology of events that occurs in conjunction with an exemplary resetting operation. Finally, a few remaining comments are made regarding the operation of the system 10.

FIG. 2A illustrates the current $I_1$ through the primary winding 24. For purposes of describing the invention, the current $I_1$ has been chosen such that it increases linearly from zero to 600 amps during the time interval 1.5 ms≦t≦8 ms (i.e., a ramp function). Outside of this time interval, the primary current $I_1$ is equal to zero amps (t<1.5 ms) or is equal to 600 amps (t<8.0 ms). Assuming a turns ratio of 600:1 (i.e., $N_1/N_2=600$), for example, a primary current $I_1$ equal to 600 amps results in a secondary current $I_2$ equal to 1.0 amp. Although the ramp function facilitates description of the invention, it should be understood that the primary current would typically be different than that illustrated. As will become apparent, however, the operation of the system 10 illustrated in FIG. 1 is essentially the same regardless of the primary current that is measured.

FIG. 2A also illustrates the voltage $V_r$ across the burden resistor 16. During intervals 100, a non-zero voltage $V_r$ is established across the burden resistor 16. The non-zero voltage $V_r$ is the result of the current transformer 12 not being saturated (therefore, the current transformer 12 is in a linear operating region and Eq. (1) applies) and is also a result of the switch 20 being open (therefore, the current from the secondary winding 26 flows through the burden resistor 16 and not through the DC source 22). Thus, as shown in FIG. 1, the secondary current $I_2$ exits the current transformer 12 and flows through the diode 14 and the burden resistor 16 to a common terminal 32. (The terminals of the primary and secondary windings 24 and 26 have been marked according to the dot convention.) Since the switch 20 is open, the reset current $I_3$ is equal to zero and the current $I_2+I_3$ through the secondary winding 26 is equal to the current $I_2$.

During the intervals 100, the voltage $V_r$ across the burden resistor 16 is proportional to the primary current $I_1$. This follows from Eq. (1) above, which is repeated here for convenience:

$$I_1 N_1 = I_2 N_2 \quad (1)$$

where, in FIG. 1, $N_1$ is the number of turns on the primary winding 24 and $N_2$ is the number of turns on secondary winding 26. Based on Eq. (1) and Ohm's law, the following relation is obtained:

$$I_1 = \frac{V_r}{R_b}\left(\frac{N_2}{N_1}\right) \quad (4)$$

where $R_b$ is the resistance of the burden resistor 16. It therefore follows that the secondary current $I_2$ provides an indirect measurement of the primary current $I_1$ (Eq. (1)), and that the voltage $V_r$ provides an indirect measurement of the secondary current $I_2$ (Eq. (4)). Thus, the primary current $I_1$ may be measured by sampling the voltage $V_r$ using the A/D converter 29.

The primary current $I_1$ and the voltage $V_r$ have been scaled in FIG. 2A such that they overlap during the intervals 100. Thus, FIG. 2B clearly shows that the voltage $V_r$ is indicative of the primary current $I_1$ during the intervals 100 (that is, during the intervals when the switch 20 is open and when the current transformer 12 is not in saturation).

During intervals 102 when the afore-mentioned conditions do not exist, the voltage $V_r$ is equal to zero. In particular, when the switch 20 is closed, the diode 14 is reverse-biased and therefore no current flows through the burden resistor 16 (i.e., $I_2=0$ and therefore $V_r=0$). On the other hand, when the current transformer 12 is saturated, there are no time varying changes in the net magnetic flux Φ and therefore no voltage is developed across the secondary winding 26 (i.e., $V_2=0$ and therefore $V_r=0$).

FIG. 2A also shows transitions 103 in the voltage $V_r$ between the intervals 100 and the intervals 102 (that is, between the intervals in which Eq. (4) applies and the intervals in which Eq. (4) does not apply). Finally, FIG. 2A shows positive transient spikes 104*a* associated with the switching of the switch 20. The spikes 104*a* are discussed in greater detail below.

FIG. 2B illustrates the net magnetic flux Φ that flows in the transformer core 28. The flow of the primary current I₁ through the primary winding 24 induces a magnetic flux Φ₁ that flows through the transformer core 28 and that magnetically couples the primary and secondary windings 24 and 26. The magnetic flux Φ₁ induces a secondary current I₂ in the secondary winding 26, and the secondary current I₂ itself also induces a magnetic flux Φ₂. Like the magnetic flux Φ₁, the magnetic flux Φ₂ flows through the transformer core 28 and magnetically couples the primary winding 24 and the secondary winding 26. If Eq. (1) was exactly true, the magnetic flux Φ₁ and the magnetic flux Φ₂ would cancel and no net magnetic flux would flow through the transformer core. In practice, however, slightly less current flows in the secondary winding than the amount predicted by Eq. (1). This difference is attributable, in general, to the fact that a non-zero voltage is developed across the secondary winding (due to the internal resistance of the secondary winding 26 and the impedance of the diode 14 and the burden resistor 16). As a result of the slight difference, there is a net magnetic flux Φ which flows through the transformer core. It is this net magnetic flux Φ that is shown in FIG. 2B.

The primary current I₁ is of sufficiently low frequency and high magnitude given the cross section of the transformer core 28 that the magnetic flux Φ₁, and in particular the net magnetic flux Φ, tends to drive the transformer core into saturation. Accordingly, FIG. 2B also shows selected intervals 108 (including a reset interval 108*a* and a measurement interval 108*b*) during which the current transformer 12 is not saturated, and intervals 110 during which the current transformer 12 is saturated. The intervals 108*b* in FIG. 2B correspond to the intervals 100 in FIG. 2A, and the intervals 108*a* in combination with the intervals 110 in FIG. 2B correspond to the intervals 102 in FIG. 2A. (Even though, for example, the intervals 108*b* and 110 occur at the same time, different reference numerals have been used to designate the intervals to facilitate describing each of the FIGS. 2A–2C individually.)

The intervals 108 during which the current transformer is not saturated are selected by the controller 18. In particular, the controller 18 selects when the transformer core 28 is not saturated by the manner in which the controller 18 controls the switch 20.

FIG. 2C illustrates the voltage V₂ across the secondary winding 26. During intervals 112, the current transformer 12 is saturated. Therefore, the voltage V₂ across the secondary winding 26 is equal to zero. The intervals 112 in FIG. 2C correspond to the intervals 110 in FIG. 2B.

During intervals 114, the switch 20 is closed and the voltage V₂ is negative. When the switch 20 closes, the voltage provided by the DC voltage source 22 is placed across the secondary winding 26. A non-zero reset current I₃ then begins to flow from the positive terminal of the DC source 22, through the secondary winding 26, and into the negative terminal of the DC source 22.

As will be recalled from Eq. (3), repeated here for convenience, the voltage V₂ across the secondary winding 26 is proportional to the change with respect to time in the net magnetic flux Φ with respect to time:

$$V_2 = N\frac{d\Phi}{dt} \tag{3}$$

Stated another way, the change in the net magnetic flux Φ is proportional to the voltage V₂ across the secondary winding 26. As a result, it is possible to change the net magnetic flux Φ by actively controlling the voltage V₂ across the secondary winding 26. This permits the transformer core 28 to be actively reset.

For example, when the voltage V₂ is made negative, the non-zero reset current I₃ that begins to flow through the secondary winding 26 induces a reset magnetic flux Φ_R in the transformer core 28. Since the only current that flows through the secondary winding 26 during this time period is the current I₃, the net magnetic flux Φ is now determined by the magnetic flux Φ₁ induced by the primary current I₁ and the reset magnetic flux Φ_R induced by the reset current I₃ (i.e., as well as an initial amount of magnetic flux Φ₀ resulting from the fact that the transformer core 28 is already saturated). At any given instant, the net magnetic flux Φ is the sum total of all magnetic fluxes that flow in the transformer core 28 and that magnetically couple the primary winding 24 and the secondary winding 26.

So long as the DC voltage supply 22 is capable of maintaining a negative voltage across the secondary winding 26, the net magnetic flux Φ will be reduced in accordance with Eq. (3) in the following manner. First, the reset magnetic flux Φ_R induced by the reset current I₃ offsets the magnetic flux Φ₁ induced by the primary current I₁:

$$\Phi_1 = \frac{I_1 N_1}{R} \tag{5a}$$

$$\Phi_R = \frac{I_3 N_2}{R} \tag{5b}$$

where R is the reluctance of the transformer core 28. Since the currents I₁ and I₃ are both positive, the magnetic fluxes Φ₁ and Φ_R will flow in opposite directions in the transformer core, that is, they will oppose each other. Moreover, the reset magnetic flux Φ_R and the magnetic flux Φ₁ will be approximately equal in magnitude since the primary current I₁ and the reset current I₃ are related by the turns ratio:

$$I_1 N_1 = I_3 N_2 \tag{6}$$

Since the reset magnetic flux Φ_R offsets the magnetic flux Φ₁ induced by the primary current I₁, the tendency of the primary current I₁ to increase the net magnetic flux Φ in the transformer core 28 is eliminated.

In practice, however, the reset current I₃ that flows is slightly larger than the amount predicted by Eq. (6). Again, the difference is attributable to the fact that a voltage exists across the primary winding 24. Importantly, however, the slight amount of additional I₃ current permits the reset magnetic flux Φ_R to dominate over the magnetic flux Φ₁. This allows the net magnetic flux Φ in the transformer core 28 to change in a direction away from saturation. In the present situation, the direction away from saturation refers to a negatively-sloped change since the net magnetic flux Φ tends to drive the transformer core 28 into positive saturation when the reset magnetic flux Φ_R is not applied. If the magnetic flux Φ tended to drive the transformer core into negative saturation when the reset magnetic flux Φ_R. is not applied, the direction away from saturation would refer to a positively-sloped change.

It may be noted that the amount of current I₃ which flows is determined automatically by the turns ratio (N₁/N₂) in combination with the primary current $I_1$ flowing in the primary winding 24. However, the voltage source 22 must be sufficiently robust so as to be able to source whatever current is required to permit the current $I_3$ to be automatically determined. So long as the voltage source 22 is sufficiently robust, then the reduction of the net magnetic flux $\Phi$ in the transformer core 28 will be governed by Eq. (3).

The width of the intervals 114 increases as the magnitude of the primary current $I_1$ increases. This occurs for the following reason: When the magnitude of the primary current $I_1$ increases, a corresponding increase is seen in the magnitude of the reset current $I_3$ (see Eq. (6)). When the magnitude of the reset current $I_3$ increases, the voltage drop seen across the winding resistance of the secondary winding 26 increases. This effectively reduces the portion of the voltage that is seen by the magnetic system of the current transformer 12. In other words, the voltage used in Eq. (3) is slightly less than the voltage of the DC source 22 as a function of the magnitude of the current $I_3$. Therefore, in order to achieve the same reduction in the net magnetic flux $\Phi$, the intervals 114 must last for a longer period of time. To this end, the controller 18 is programmed to implement a pulse width modulator that varies the width of the intervals 114 (or pulses) as a function of the magnitude of the primary current. A preferred way of programming the controller 18 in this way is detailed below.

Finally, during intervals 116, the switch 20 is open and the current transformer 12 is not saturated but rather operates in a linear operating region. Since the current transformer 12 is not saturated, the voltage $V_2$ is non-zero and the flow of the primary current $I_1$ is able to induce a non-zero secondary current $I_2$ in the secondary winding 26. Moreover, since the switch 20 is open, the secondary winding is again passive. Therefore, the current $I_2$ that flows through the secondary winding 26 is due only to the primary current $I_1$. Therefore, it is possible to measure the primary current $I_1$ by measuring the voltage $V_r$ across the burden resistor 16.

The intervals 116 in FIG. 2C correspond to the intervals 100 in FIG. 2A. The magnitude of the voltage $V_r$ during these intervals is slightly less than the voltage $V_2$ due to the voltage drop across the diode 14. In both cases, however, the positive voltages are the result of only the secondary current $I_2$, and not of the DC source 22 (since the switch 20 is open).

Like FIG. 2B, FIG. 2C also shows transients 104b associated with the switching of the switch 20. The transients occur for the following reason: The opening and closing of the switch 20 in FIG. 1 begins before any primary current $I_1$ starts flowing. When no primary current $I_1$ is flowing, the transformer core 28 is driven into negative saturation when a negative voltage $V_2$ is placed across the secondary winding 26. In negative saturation, the secondary winding 26 behaves like an air core inductor and is not magnetically coupled with the primary winding 24 (i.e., Eq. (6) does not apply). Therefore, all that limits the flow of current through the secondary winding 26 is the winding resistance of the secondary winding 26. Thus, the sudden change in current in the secondary winding 26 causes a voltage transient to appear.

FIGS. 2A–2C will now be discussed in combination with respect to a chronology of events that occurs in conjunction with an exemplary resetting operation. Initially, at an instant $t_0$ shortly after non-zero primary current $I_1$ is applied, the transformer core 28 is not saturated. A non-zero secondary current $I_2$ flows from the secondary winding 26 flows through the diode 14 and the burden resistor 16. Thus, the secondary current $I_2$ establishes a positive voltage $V_2$ across the secondary winding 26. Therefore, since the voltage $V_2$ is positive, the net magnetic flux $\Phi$ in the transformer core 28 is increasing.

At an instant $t_1$, the transformer core 28 first becomes saturated. In the interval between the instants $t_1$ and $t_2$, the switch 20 remains open. (The interval between the instants $t_1$ and $t_2$ is a portion of one of the intervals 102 in FIG. 2A, is one of the intervals 110 in FIG. 2B, and is one of the intervals 112 in FIG. 2C.) Thus, the current transformer 12 remains saturated, and it is impossible to measure the primary current $I_1$ based on the secondary current $I_2$, because the voltages $V_2$ and $V_r$ are equal to zero and no current flows through the burden resistor 16.

At the instant $t_2$, the switch 20 transitions from being opened (initial state) to being closed (reset state). When the switch 20 closes, this action simultaneously applies a negative reset voltage to the secondary winding 26, provides the reset current $I_3$ to the secondary winding, and induces the reset magnetic flux $\Phi_R$ that flows through the core and that opposes the first magnetic flux. The switch 20 remains closed during the interval between the instants $t_2$ and $t_3$. (The interval between the instants $t_2$ and $t_3$ is a portion of one of the intervals 102 in FIG. 2A, is one of the intervals 108a in FIG. 2B, and is one of the intervals 114 in FIG. 2C.) Since the voltage $V_2$ is negative during the interval between the instants $t_2$ and $t_3$, it follows from Eq. (3) that the net magnetic flux $\Phi$ in the transformer core 28 will decrease during this interval, as shown in FIG. 2B.

At the instant $t_3$, the switch 20 is opened and the voltage $V_2$ across the secondary winding 26 is no longer forced to be negative. Accordingly, the current $I_2+I_3$ in the secondary winding 26 begins to flow through the diode 14 and the burden resistor 16 instead of through the voltage source 22. Thus, the reset current $I_3$ becomes zero and the current $I_2$ assumes the previous value of the current $I_3$, although the magnitude of the current $I_2+I_3$ remains the same.

Between the instants $t_3$ and $t_4$, the switch 20 remains opened. (The interval between the instants $t_3$ and $t_4$ is one of the intervals 100 in FIG. 2A, is one of the intervals 108b in FIG. 2B, and is one of the intervals 116 in FIG. 2C.) Since the transformer core 28 is not saturated, Eqs. (1) and (4) apply and the voltage $V_r$ across the burden resistor 16 can be used to measure the primary current $I_1$. The voltage $V_r$ is measured using the controller 18 including the analog-digital converter 29. Preferably, the sampling operation is initiated after a short delay after the instant $t_3$ so as to give any transients an opportunity to decay. Of course, since the controller 18 controls the switch 20, the controller 18 knows when the instant $t_3$ occurs and knows when to initiate sampling of the voltage $V_r$ so as to obtain an accurate measurement of the primary current $I_1$.

The flow of the secondary current $I_2$ through the diode 14 and the burden resistor 16 establishes a positive voltage $V_2$ across the secondary winding 26. Therefore, the net magnetic flux $\Phi$ in the transformer core 28 increases (see FIG. 2B) until at an instant $t_4$ at which the transformer core 28 becomes saturated. When the transformer core 28 saturates, the voltages $V_r$ and $V_2$ return to a zero value for the reasons previously described, namely, the $$\frac{d\Phi}{dt}$$

term in Eq. (3) returns to zero. The instant $t_4$ therefore corresponds to the instant $t_1$ at which the transformer core first became saturated. Thereafter, it is possible to perform additional resetting operations in order to obtain additional measurements of the primary current $I_1$.

It would also be possible to implement the system in FIG. 1 such that the transformer core 28 never becomes saturated. For example, to achieve such a result, the transformer core 28 could be actively reset as soon as the transformer core 28 begins to saturate. Thus, while the magnetic flux $\Phi_1$ would tend to drive the transformer core 28 into saturation, such saturation would be prevented by timely closure of the switch 20. However, this approach is not preferred.

During the time interval after 8.0 ms, the primary current $I_1$ is a DC current and remains at a constant 600 amps. Nevertheless, although the primary current $I_1$ is a DC current with an extremely large magnitude, the current sensing system 10 is able to accurately measure the primary current $I_1$. It is thus seen that the current sensing system 10 is able to measure currents of extremely low frequency (including DC currents) and with an extremely large magnitude, and therefore that the current sensing system 10 has a tremendous dynamic range.

Having now described FIGS. 2A–2C in combination with respect to a chronology of events that occurs in conjunction with an exemplary resetting operation, a few remaining comments will now be made regarding the operation of the system 10.

First, the cross section of the transformer core 28 may be made smaller than in conventional current measuring systems. In the system 10, the size of the transformer core 28 is primarily a function of the sampling frequency. The sampling frequency may be, for example, one or two or more orders of magnitude higher than the frequency of the measured current. Thus, for a sixty hertz current, for example, rather than use a transformer that is responsive to sixty hertz, a transformer could be used that is responsive to two kilohertz. This allows the size and cost of the transformer utilized to be reduced.

Additionally, the system 10 may have two modes of operation by utilizing or not utilizing the active reset functionality. When the current transformer 12 is not saturated, then the voltage $V_r$ across the burden resistor 16 provides an accurate indication of the primary current $I_1$ without there being any need to actively reset the current transformer 12. Accordingly, the switch 20 may be left in an open position indefinitely to measure higher frequency currents. Thus, in one mode of operation, the system 10 may be used to measure currents having a frequency in the range of hertz, and in a second mode of operation the system 10 may be used to measure currents having a frequency in the range of kilohertz. Thus, using the current transformer 12 in the system 10 as opposed to in a conventional current sensing system in no way limits the dynamic range of the current transformer 12, but rather only extends its dynamic range to include lower frequency/higher magnitude currents.

Second, as previously noted, the controller 18 is programmed to implement a pulse width modulator that varies the length of the intervals 114 (or pulses) as a function of the magnitude of the primary current. The length of the intervals 114 should be sufficient to give the analog-digital converter 29 adequate time to sample the voltage $V_r$. On the other hand, the intervals 144 should not be so long that the transformer core 28 is driven into negative saturation by the source 22 for extended periods of time. When the transformer core 28 is driven into negative saturation by the source 22 for extended periods of time, unnecessary heating occurs because the secondary winding 26 becomes purely resistive and power from the voltage source 22 is dissipated as heat.

To this end, therefore, the controller 18 uses an immediately preceding measurement of the primary current $I_1$ as a basis for determining the length of the intervals 114. The immediately preceding measurement of the primary current $I_1$ is used to predict the current value of the primary current $I_1$. Based on the expected value of the primary current $I_1$, the amount of time required to achieve a desired reduction in the net magnetic flux $\Phi$ is determined.

Figure 3:
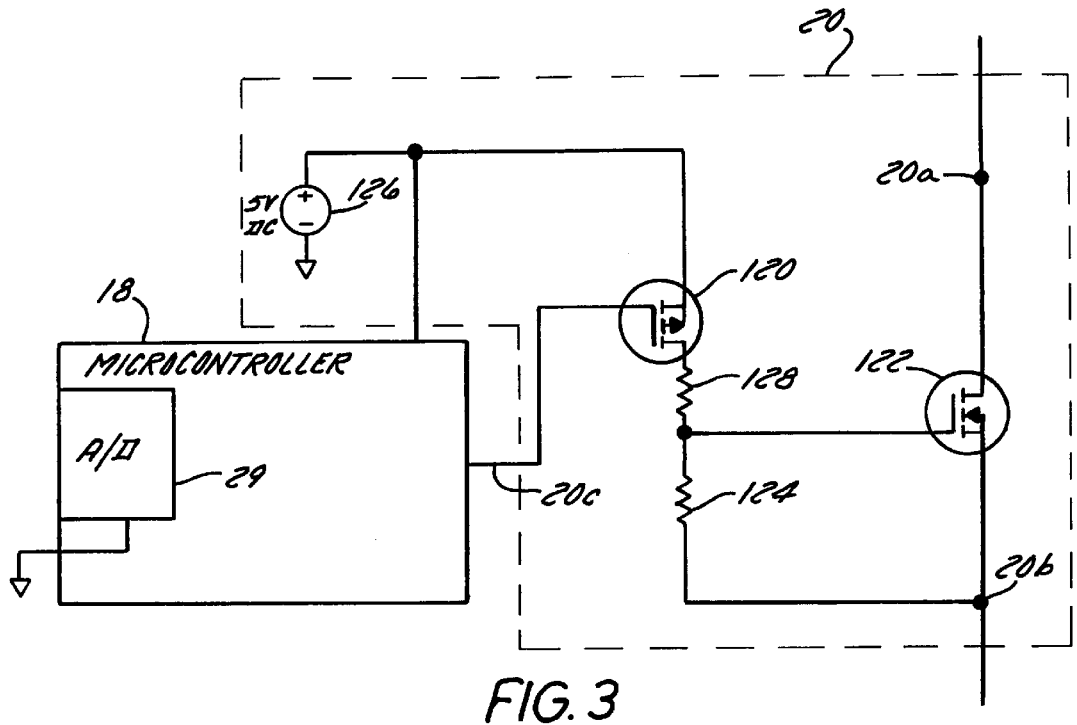
FIG. 3 is a schematic diagram of a switch used in the current sensing system of FIG. 1.

Referring now to FIG. 3, one example of the implementation of the switch 20 of FIG. 1 is illustrated. For clarity, terminals 20a, 20b, and 20c of the switch 20 have been marked in both FIG. 1 and FIG. 3 to show the correspondence between the two figures. The switch 20 comprises transistors 120 and 122, a resistor 124 and a second DC voltage supply 126.

The control input to the switch 20 is received by the transistor 120 from the controller 18. When the controller 18 turns on the transistor 120, the transistor 120 turns on the transistor 122, thereby causing the switch 20 to turn on. In contrast, when the controller 18 turns off the transistor 120, the transistor 120 turns off the transistor 122, thereby causing the switch 20 to turn off. The second DC source 126 is used to supply the controller 18 and to provide the correct biasing for the transistors 120 and 122.

The switch 20 comprises more than a simple transistor only because it is necessary to voltage level shift the input from the controller 18. This level shifting is required by the fact that the controller 18 is referenced to the same common as the burden resistor 16 and the DC source 22, which may for example be a twenty-four volt source. Thus, if the output of the controller 18 were connected directly to the gate of the transistor 122, the gate would vary between twenty-four and twenty-nine volts, and the transistor 122 would always be turned on regardless of the output of the controller 18. The additional circuitry therefore simply provides the required level shifting.

Figure 4:
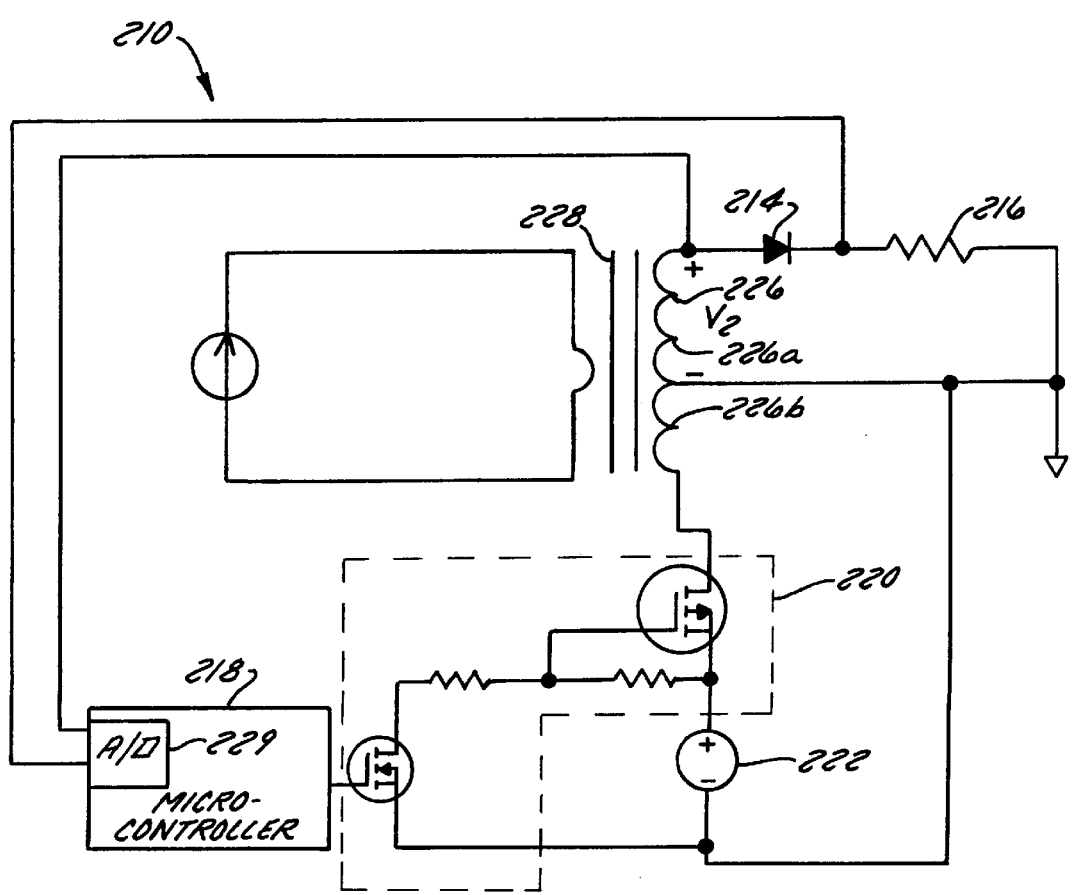
FIG. 4 is a schematic diagram of an alternative implementation of the embodiment of the invention illustrated in FIG. 1.

Referring now to FIG. 4, an alternative implementation of the embodiment of FIG. 1 is illustrated. Like components are designated using the same reference numerals as in FIG. 1 incremented by 200.

The system 210 of FIG. 4 is different from the system 10 of FIG. 1 in that it uses a secondary winding 226 formed of two windings 226a and 226b. The winding 226a is a sense winding and the winding 226b is a reset winding. Although the secondary winding 226 is shown as being formed of a single winding with a center tap, it could also be formed of two physically separate windings. Functionally, both the sense winding and the reset winding are implemented by the winding 26 in the system 10 of FIG. 1.

The operation of the system 210 is generally the same as the operation of the system 10. In particular, when switch 220 turns on, a negative voltage is applied to the secondary winding and in particular across the winding 226b. This negative voltage decreases the net magnetic flux $\Phi$ in the winding core 228 in the same manner as described in conjunction with FIG. 1. When the current transformer 228 is not saturated, the current flowing out of the sense winding 226a and through the burden resistor 216 can be used to measure the primary current.

The primary benefit achieved by this arrangement is that the system 210 can be constructed using a single positive power supply (i.e., the DC source 222 having a negative terminal connected to common). In contrast, the system 10 of FIG. 1 requires both a negative power supply (i.e., the DC source 22 having a positive terminal connected to common) and a positive power supply (i.e., the DC source 126 shown in FIG. 3 having a negative terminal connected to common). In some applications, it is important and/or advantageous for reasons of cost to use only a single positive power supply.

Also shown in FIG. 4 is a connection between the analog-digital converter 229 and the anode of the diode 214. This arrangement is used to provide an alternative method for determining when to terminate the intervals 114. In particular, referring again to FIGS. 2A–2C, the analog-digital converter 229 samples the voltage $V_2$ during the interval between the instants $t_2$ and $t_3$. By monitoring the voltage $V_2$ during this interval, the controller 218 is able to determine when the transformer core 228 enters negative saturation (i.e., because the voltage $V_2$ begins to rapidly decay to zero). Therefore, when this rapid decay is detected, the controller 218 opens the switch 220. Since the transformer core 228 has become negatively saturated, the amount of change required in the net magnetic flux $\Phi$ before the transformer core 228 becomes positively saturated is maximized. In this way, the length of the interval between the instants $t_3$ and $t_4$ is maximized.

Referring now to Figs. 5A–5C, the operation of the system 10 in conjunction with a sinusoidal primary current is illustrated. FIGS. 5A–5C correspond to FIGS. 2A–2C, respectively. As previously indicated, the operation of the invention is the same regardless of the primary current that is measured. Accordingly, FIGS. 5A–5C are not discussed in detail, since the above discussion of FIGS. 2A–2C is directly applicable to FIGS. 5A–5C.

One feature that is apparent from FIGS. 5A–5C that is not immediately apparent from FIGS. 2A–2C is that the systems 10 and 210 are a monopolar implementation of the invention. By this, it is meant that the systems 10 and 210 measure either positive or negative current but not both. For example, the primary current in FIG. 5A comprises a positive half-wave 250 and a negative half-wave 252. The systems 10 and 210 measure only one of the half-waves of the sinusoidal current. In general, this is acceptable since the positive and negative half-waves are identical or nearly identical except that they are of opposite polarity and are phase shifted by 180°. Indeed, in the vast majority of applications, a monopolar current sensing arrangement is not only acceptable but is preferred because it reduces cost and complexity of the current sensing system without any significant loss in function.

Figure 2:
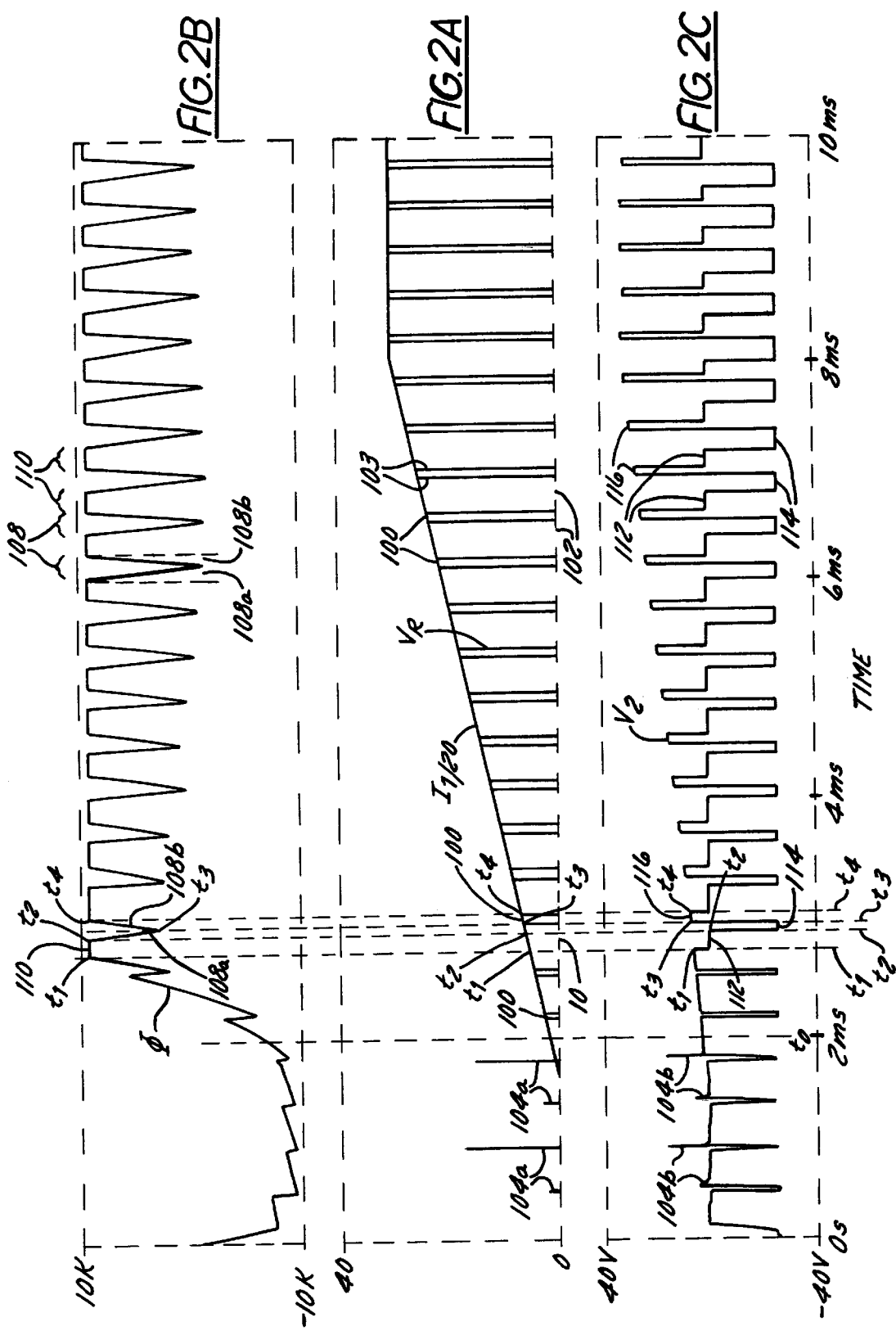
FIGS. 2A–2C are graphs that show the operation of the system of FIG. 1 in conjunction with an exemplary primary current.

From the foregoing description of the current sensing system described in conjunction with FIGS. 1–3 (as well as the current sensing system described in conjunction with FIG. 4), a number of advantageous features are apparent. In particular, the current sensing system has a tremendous dynamic range. The current sensing system is able to measure currents that are both of a low frequency and a high magnitude. For example, the current sensing system can even measure DC currents and other currents with DC current components which in steady state would otherwise require a transformer core with an infinite cross section. In the disclosed current sensing system, the size of the cross section of the transformer core is determined based on a sampling frequency and not based on the frequency of the measured current.

In the disclosed system, the transformer core is actively reset to prevent it from being saturated at least during selected time intervals. This allows the primary current to be measured during the selected time intervals.

This same technique can be applied throughout a wide range of frequencies with beneficial effects. To measure a current of a given frequency using this technique, the current sensing system is able to utilize a current transformer that has a core with a reduced cross section as compared to that which would be needed by conventional current measuring systems. Moreover, as the magnitude of the measured current increases, the increased magnitude may be addressed by supplying more current when the transformer core is actively reset. Thus, it is not necessary to increase the size of the cross section of the transformer core to handle larger magnitude currents.

Finally, these advantages can be achieved by way of a circuit that is simple and that is possible to implement with a minimum number of additional parts. Therefore, the foregoing benefits may be achieved with minimal additional size, cost and complexity.

Many other changes and modifications may be made to the present invention without departing from the spirit thereof. The scope of these and other changes will become apparent from the appended claims.

I claim:

1. A method of measuring a current comprising:
   (A) receiving the current at a primary winding and permitting the current to flow through the winding, the primary winding being magnetically coupled to a core, the flow of the current through the primary winding inducing a first magnetic flux that flows through the core and that tends to drive the core into saturation;
   (B) actively resetting the core to prevent the core from being saturated at least during selected time intervals, the resetting step including coupling an energy source to a secondary winding that is magnetically coupled to the core to induce a reset magnetic flux that flows through the core and opposes the first magnetic flux, and controlling the energy source in accordance with the magnitude of the current; and
   (C) measuring the current during at least a plurality of the selected time intervals.

2. A method according to claim 1,
   wherein the selected time intervals each comprise a reset time interval and a separate measurement time interval,
   wherein, during the reset time interval, the net magnetic flux changes in a direction away from saturation, and
   wherein, during the measurement interval, the current is measured while the net magnetic flux changes in a direction toward saturation.

3. A method according to claim 1, coupling and controlling steps in combination comprising changing a state of a switch that controls the energy source from an initial state to a reset state, the switch being coupled to the energy source and to the secondary winding, the changing of the state of the switch causing a net magnetic flux in the core to change in a direction away from saturation, the net magnetic flux being a sum of all magnetic fluxes that magnetically couple the primary and secondary windings.

4. A method according to claim 3, wherein the measuring step further includes returning the state of the switch to the initial state and thereafter measuring a current that flows in the secondary winding.

5. A method according to claim 1, wherein the energy source applies a reset voltage to the secondary winding, the reset voltage determining a rate at which a net magnetic flux that flows in the core changes in a direction away from saturation, and the net magnetic flux being a sum of all magnetic fluxes that magnetically couple the primary and secondary windings.

6. A method according to claim 5, wherein the magnitude of the rate at which the net magnetic flux changes in the direction away from saturation is approximately proportional to the magnitude of the reset voltage that is applied to the secondary winding.

7. A method according to claim 1, wherein the energy source provides a reset current to the secondary winding, and wherein the reset magnetic flux causes a net magnetic flux that flows in the core to change in a direction away from saturation, the net magnetic flux being a sum of all magnetic fluxes that magnetically couple the primary and secondary windings.

8. A method according to claim 1, wherein the reset magnetic flux causes a net magnetic flux that flows in the core to change in a direction away from saturation, the net magnetic flux being a sum of all magnetic fluxes that flow through the primary winding and that flow in a closed path through the transformer core.

9. A method according to claim 1, wherein the current that is measured during the measuring step comprises a DC current component.

10. A method of measuring a primary current using a current transformer having a transformer core, a primary winding and a secondary winding, the primary and secondary windings being magnetically coupled to the transformer core, the method comprising:

(A) receiving the primary current at the primary winding and permitting the primary current to flow through the primary winding, the flow of the primary current through the primary winding inducing a first magnetic flux (1) that flows through the transformer core, (2) that magnetically couples the primary and secondary windings, and (3) that tends to drive the transformer core into saturation;

(B) actively resetting the core to prevent the core from being saturated at least during selected time intervals, the resetting step including providing a pulse width modulated reset current, the pulse width of the reset current being modulated in accordance with a magnitude of the primary current, the reset current inducing a reset magnetic flux that flows through the transformer core and that opposes the first magnetic flux, the reset magnetic flux causing a net magnetic flux that flows in the transformer core to change in a direction away from saturation, the net magnetic flux being a sum of all magnetic fluxes that magnetically couple the primary and secondary windings;

(C) measuring the primary current during at least a plurality of the selected time intervals, including
  (1) permitting a secondary current to flow in the secondary winding, the flow of the secondary current being induced by the flow of the first magnetic flux, and
  (2) measuring the secondary current to obtain an indirect measurement of the primary current.

11. A method according to claim 10,
wherein the flow of the secondary current induces a second magnetic flux that flows through the transformer core,
wherein, when the secondary current flows, the sum of the first and second magnetic fluxes is sufficient to drive the transformer core into saturation.

12. A method according to claim 10, wherein the measuring step (C)(2) includes measuring a voltage across a resistor through which the secondary current flows to obtain an indirect measurement of the secondary current.

13. A method according to claim 10, wherein the actively resetting step is performed using a source coupled to the secondary winding, and wherein the reset magnetic flux causes the net magnetic flux to change in the direction away from saturation.

14. A method according to claim 13, wherein the secondary winding comprises a reset winding and a sense winding, wherein the source is coupled to the reset winding, and wherein during the measuring step the secondary current flows through the sense winding.

15. A circuit for measuring a first current, the circuit comprising:

(A) a core;
(B) a first winding, the first winding being magnetically coupled to the core, the first winding having the first current flowing therethrough, the flow of the first current inducing a first magnetic flux that flows through the core and that tends to drive the core into saturation;
(C) a second winding, the second winding being magnetically coupled to the core, and the second winding being magnetically coupled to the first winding by the first magnetic flux;
(D) a switch;
(E) a source; and
(F) a pulse width modulator, the pulse width modulator being electrically coupled to the switch, the pulse width modulator providing a control signal to the switch that causes the switch to selectively couple the source to the second winding to provide a pulse width modulated reset current to the second winding, the pulse width of the reset current being modulated in accordance with a magnitude of the first current;

wherein the reset current induces a reset magnetic flux that flows through the core, the reset magnetic flux opposing the first magnetic flux and at least temporarily preventing the core from being saturated.

16. A circuit according to claim 15,
wherein, for at least a part of the time that the source is not coupled to the second winding, the first magnetic flux induces a second current to flow in the second winding, and
wherein the pulse width modulator causes the second current to be measured to obtain a measurement of the first current.

17. A circuit according to claim 15,
wherein the second winding includes a reset winding and a sense winding,
wherein, when the source is coupled to the second winding, the source causes the reset current to flow in the reset winding, the flow of the reset current in the reset winding inducing the reset magnetic flux,
wherein, for at least a part of the time that the source is not coupled to the secondary winding, the first magnetic flux induces a second current to flow in the sense winding, and
wherein the pulse width modulator causes the second current to be measured to obtain a measurement of the first current.

18. A circuit according to claim 15 wherein, when the source is coupled to the second winding, the source applies a reset voltage to the second winding, the reset voltage causing the reset current to flow, the magnitude of the reset voltage being approximately proportional to the magnitude of the rate at which a net magnetic flux that flows in the core changes in a direction away from saturation, the net magnetic flux being a sum of all magnetic fluxes that magnetically couple the primary and secondary windings.

19. A method of measuring a primary current using a current transformer having a transformer core, a primary winding, and a secondary winding, the method comprising:

(A) driving the current transformer into saturation, including the step of causing the primary current to flow through the primary winding, the primary current inducing a first magnetic flux that flows through the transformer core and that magnetically couples the primary and secondary windings, the flow of the first magnetic flux through the transformer core inducing a secondary current that flows through the secondary winding, the flow of the secondary current through the secondary winding inducing a second magnetic flux that flows through the core and that magnetically couples the primary and secondary windings, the first magnetic flux and the second magnetic flux resulting in a net magnetic flux that drives the current transformer into saturation, and the net magnetic flux that flows through the transformer being at a maximum magnitude in saturation; then (B) driving the current transformer out of saturation, including the step of causing a reset current to flow through the secondary winding of the current transformer, the reset current inducing a reset magnetic flux that flows through the transformer core and that magnetically couples the primary and secondary windings, the reset magnetic flux (1) opposing the first magnetic flux, (2) driving the current transformer out of saturation, and (3) reducing the net magnetic flux being to a minimum magnitude, the minimum magnitude being determined by an instant at which the flow of the reset current through the secondary winding is terminated, the instant at which the flow of the reset current through the secondary winding is terminated being determined by monitoring a voltage across the secondary winding; then (C) measuring the secondary current while the current transformer is not in saturation and while the net magnetic flux is returning from the minimum magnitude to the maximum magnitude;

(D) repeating steps (A) through (C) a plurality of times so as to obtain a plurality of measurements of the primary current.

20. A method according to claim 19,
wherein the secondary current flows through a burden resistor that is connected to the secondary winding; and
wherein the step of measuring the secondary current includes the step of measuring a voltage produced across the burden resistor by the second current.

21. A method according to claim 19, wherein the reset current is supplied to the secondary winding by a source, and wherein the step of causing the reset current to flow through the secondary winding includes the step of closing a switch that is electrically disposed between the source and the secondary winding.

22. A method according to claim 19,
wherein the secondary winding comprises a reset winding and a sense winding;
wherein, during the step of causing the primary current to flow through the primary winding, the secondary current is caused to flow through the sense winding; and
wherein, during the step of causing the reset current to flow through the secondary winding, the reset current is caused to flow through the reset winding.

23. A circuit for measuring a first current, the circuit comprising:

(A) a core;
(B) a first winding, the first winding being magnetically coupled to the core, the first winding having the first current flowing therethrough, the flow of the first current inducing a first magnetic flux that flows through the core and that tends to drive the core into saturation;
(C) a second winding, the second winding being magnetically coupled to the core, and the second winding being magnetically coupled to the first winding by the first magnetic flux;
(D) a switch;
(E) a source; and
(F) a controller, the controller being electrically coupled to the switch, the controller providing a control signal to the switch that causes the switch to selectively couple the source to the second winding in accordance with the magnitude of the first current;

wherein, when the source is coupled to the second winding, the source causes a reset magnetic flux to flow through the core, the reset magnetic flux opposing the first magnetic flux and at least temporarily preventing the core from being saturated.

* * * * *